United States Patent
Reynolds et al.

(10) Patent No.: US 8,799,346 B2
(45) Date of Patent: Aug. 5, 2014

(54) BELIEF PROPAGATION PROCESSOR

(75) Inventors: David Reynolds, Scarborough, ME (US); Benjamin Vigoda, Winchester, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 487 days.

(21) Appl. No.: 13/079,204

(22) Filed: Apr. 4, 2011

(65) Prior Publication Data
US 2011/0295786 A1 Dec. 1, 2011

Related U.S. Application Data

(63) Continuation of application No. PCT/US2010/025956, filed on Mar. 2, 2010.

(60) Provisional application No. 61/156,792, filed on Mar. 2, 2009, provisional application No. 61/293,999, filed on Jan. 11, 2010.

(51) Int. Cl.
*G06G 7/00* (2006.01)

(52) U.S. Cl.
USPC ....................................................... 708/801

(58) Field of Classification Search
CPC ........... G06G 7/14; G06J 1/00; G06N 3/0635; G06N 3/063; G06E 3/005
USPC ....................................................... 708/801
See application file for complete search history.

(56) References Cited

U.S. PATENT DOCUMENTS

| 4,649,515 | A | | 3/1987 | Thompson |
| 5,243,688 | A | | 9/1993 | Pechanek |
| 5,539,404 | A | * | 7/1996 | Nagazumi ..................... 341/150 |
| 5,634,067 | A | * | 5/1997 | Nagazumi ..................... 712/19 |
| 5,745,382 | A | | 4/1998 | Vilim |
| 5,959,871 | A | | 9/1999 | Pierzchala |
| 6,185,331 | B1 | | 2/2001 | Shi |

(Continued)

FOREIGN PATENT DOCUMENTS

| EP | 0614157 | 10/1999 |
| EP | 1137001 | 9/2001 |

(Continued)

OTHER PUBLICATIONS

D'Mello, Design Approaches to Field-Programmable Analog Integrated Circuits, Analog Integrated Circuits and Signal Processing, 17(1-2), 1998.

(Continued)

*Primary Examiner* — Tan V. Mai
(74) *Attorney, Agent, or Firm* — Occhiuti & Rohlicek LLP

(57) ABSTRACT

A processor includes a first memory module for storing a first set of storage values each representing a respective input, and a second memory module for storing a second set of storage values in analog form. An analog module is coupled to the first and the second memory modules. The analog module is configured to, in each operation cycle of at least one iteration, update at least some of the second set of storage values based on the first and the second sets of storage values. An output module is for generating a set of outputs from at least some of the second set of storage values.

25 Claims, 15 Drawing Sheets

(56) References Cited

U.S. PATENT DOCUMENTS

| | | | |
|---|---|---|---|
| 6,188,998 | B1* | 2/2001 | Cuce' et al. .................. 706/7 |
| 6,212,654 | B1 | 4/2001 | Lou |
| 6,279,133 | B1 | 8/2001 | Vafai |
| 6,282,559 | B1 | 8/2001 | Helfenstein |
| 6,584,486 | B1 | 6/2003 | Helfenstein |
| 6,633,856 | B2 | 10/2003 | Richardson |
| 6,744,299 | B2 | 6/2004 | Geysen |
| 6,762,624 | B2 | 7/2004 | Lai |
| 6,763,340 | B1 | 7/2004 | Burns |
| 6,771,197 | B1 | 8/2004 | Yedidia |
| 6,938,196 | B2 | 8/2005 | Richardson |
| 6,957,375 | B2 | 10/2005 | Richardson |
| 7,071,846 | B2 | 7/2006 | Moerz |
| 7,203,887 | B2 | 4/2007 | Eroz |
| 7,292,069 | B2 | 11/2007 | Hannah |
| 7,373,585 | B2 | 5/2008 | Yedidia |
| 7,418,468 | B2 | 8/2008 | Winstead |
| 7,669,106 | B1 | 2/2010 | Farjadrad |
| 7,769,798 | B2 | 8/2010 | Banihashemi |
| 7,814,402 | B2 | 10/2010 | Gaudet |
| 2004/0030414 | A1 | 2/2004 | Koza |
| 2004/0136472 | A1 | 7/2004 | Vigoda et al. |
| 2005/0165879 | A1 | 7/2005 | Nikitin |
| 2005/0240647 | A1 | 10/2005 | Banihashemi |
| 2006/0026224 | A1 | 2/2006 | Merkli |
| 2006/0248317 | A1* | 11/2006 | Vorbach et al. .............. 712/221 |
| 2008/0065573 | A1 | 3/2008 | Macready |
| 2008/0077839 | A1 | 3/2008 | Gross |
| 2008/0148128 | A1 | 6/2008 | Sharon et al. |
| 2008/0174460 | A1 | 7/2008 | Vigoda |
| 2008/0195913 | A1 | 8/2008 | Bates |
| 2008/0256343 | A1 | 10/2008 | Gross |
| 2008/0285688 | A1 | 11/2008 | Arzel |
| 2008/0294970 | A1 | 11/2008 | Gross |
| 2008/0307292 | A1 | 12/2008 | Gaudet |
| 2009/0100313 | A1 | 4/2009 | Gross |
| 2009/0144218 | A1 | 6/2009 | Bonawitz |
| 2009/0228238 | A1 | 9/2009 | Mansinghka |
| 2010/0017676 | A1 | 1/2010 | Gross |
| 2010/0033228 | A1 | 2/2010 | Gershenfeld |
| 2010/0301899 | A1 | 12/2010 | Vigoda |
| 2010/0306150 | A1 | 12/2010 | Reynolds |
| 2010/0306164 | A1 | 12/2010 | Reynolds |

FOREIGN PATENT DOCUMENTS

| | | |
|---|---|---|
| EP | 1819054 | 8/2007 |
| WO | WO00/41507 | 7/2000 |
| WO | WO2009/137227 | 11/2009 |
| WO | WO2010/101933 | 9/2010 |
| WO | WO2010/101941 | 9/2010 |
| WO | WO2010/101944 | 9/2010 |
| WO | WO2010/111589 | 9/2010 |

OTHER PUBLICATIONS

Eguchi, Simple Design of a Discrete-Time Chaos Circuit Realizing a Tent Map, IEICE Trans. Electron. vol. E83-C(5), May 2000.
Gross, Stochastic Implementation of LDPC Decoders, Signals, Systems and Thirty-Ninth Asilomar Conference 2005.
Hagenauer, A Circuit-Based Interpretation of Analog MAP Decoding with Binary Trellises, Proc. 3rd ITG Conference Source and Channel Coding, Munchen, 2000.
Hagenauer, Analog Decoders and Receivers for High Speed Applications, Proc. of 2002 Int. Zurich Sem. on Broadband Comm, 2002.
Haley, An Analog LDPC Codec Core, Proc. Int. Symp. on Turbo Codes and Related Topics, 2003.
Kschischang, Factor Graphs and the Sum-Product Algorithm, IEEE Trans. Info. Theory, 47(2), 2001.
LeCun, Loss Functions for Discriminative Training of Energy Based Models, In Proc. of the 10-th International Workshop on Artificial Intelligence and Statistics, 2005.
Loeliger, Decoding in Analog VLSI, IEEE Communications Magazine, pp. 99-101, Apr. 1999.
Loeliger, Probability Propagation and Decoding in Analog VLSI, IEEE Transactions on Information Theory, 2001.
Loeliger, Analog Decoding and Beyond, ITW2001, 2pgs., Sep. 2001.
Loeliger, Some Remarks on Factor Graphs, Brest 2003.
Loeliger, An Introduction to Factor Graphs, IEEE Signal Processing Magazine, pp. 28-41, Jan. 2004.
Luckenbill, Building Bayesian Networks with Analog Subthreshold CMOS Circuits, Yale University, 2002.
Lustenberger, On the Design of Analog VLSI Iterative Decoders, ETH No. 13879, Zurich, 2000.
Mansinghka, Stochastic Digital Circuits for Probabilistic Inference, MIT, Cambridge, Nov. 2008.
Mansinghka, Natively Probabilistic Computation, MIT Ph.D. 2009.
Nguyen, A 0.8V CMOS Analog Decoder for an (8,4,4) Extended Hamming Code, Proceedings of the 2004 International Symposium on Circuits and Systems, 2004.
Rapley, Stochastic Iterative Decoding on Factor Graphs, Proc. 3rd Int. Symp. on Turbo Codes and Related Topics, pp. 507-510, 2003.
Schaefer, Analog Rotating Ring Decoder for an LDPC Convolutional Code, ITW2003, Paris, France, Mar. 31-Apr. 4, 2003.
Sequin, Analogue 16-QAM demodulator, Electronics Letters vol. 40, No. 18, 2004.
Stan, Analog Turbo Decoder Implemented in SiGe BiCMOS Technology, U. of Virginia, Dec. 15, 2002.
Tehrani, Stochastic Decoding of LDPC Codes, IEEE Communications Letters 10(10) Oct. 2006.
Tehrani, Survey of Stochastic Computation on Factor Graphs, ISMVL '07 Proceedings of the 37th International Symposium on Multiple-Valued Logic 2007.
Tehrani, Tracking Forecast Memories in Stochastic Decoders, IEEE ICASSP 2009.
Vigoda, A Nonlinear Dynamic System for Spread Spectrum Code Acquisition, MIT M.S. Thesis, Aug. 1999.
Vigoda, Analog Logic: Continuous-Time Analog Circuit for Statistical Signal Processing, MIT Ph.D. Thesis, Sep. 2003.
Vigoda, Synchronization of Pseudorandom Signals by Forward-Only Message Passing With Application to Electronic Circuits, IEEE Trans. Info. Theory, Aug. 2006.
Wang, Reduced Latency Iterative Decoding of LDPC Codes, MERL TR2005-103, 2005.
Winstead, Analog MAP Decoder for (8,4) Hamming Code in Subthreshold CMOS, ISIT 2001.
Winstead, Analog Iterative Error Control Decoders, U. Alberta, Ph.D. Thesis, 2005.
Winstead, Analog Soft Decoding for Multi-Level Memories, Proc. IEEE Int. Symp. on Multiple-Value Logic (ISMVL'05), 2005.
Winstead, Stochastic Iterative Decoders, International Symposium on Information Theory 2005.
International Search Report for PCT/US2010/02556, May 11, 2010.

* cited by examiner

|  | Clock Cycle | | | |
|---|---|---|---|---|
|  | 0 | 1 | 2 | 3 |
| variable node A inputs | B1 | B0 | B2 | B0 |
|  | C1,1 | C3,0 | C1,2 | C1,0 |
| variable node B inputs | B3 | B1 | B5 | B3 |
|  | C3,3 | C0,1 | C1,5 | C0,3 |
| variable node C inputs | B4 | B2 | B6 | B4 |
|  | C3,4 | C2,2 | C3,6 | C0,4 |
| variable node D inputs | B7 | B5 | B7 | B6 |
|  | C2,7 | C2,5 | C0,7 | C2,6 |
| check node a output | C0,1 | C1,0 | C2,2 | C3,0 |
| check node b output | C0,3 | C1,1 | C2,5 | C3,3 |
| check node c output | C0,4 | C1,2 | C2,6 | C3,4 |
| check node d output | C0,7 | C1,5 | C2,7 | C3,6 |

FIG. 9

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|----|----|----|----|----|----|----|----|----|----|----|----|----|----|
| 0 | 0 |   | 8 |   | 21 |   | 22 |   | 16 |   | 37 |   | 21 |   | 6 |   | 43 | 0 |   |   |   |   |   |   |
| 1 |   | 31 |   | 40 |   | 15 |   | 1 |   | 7 |   | 16 |   | 18 |   | 22 |   | 0 | 0 |   |   |   |   |   |
| 2 | 4 |   | 39 |   | 28 |   | 12 |   | 38 |   | 7 |   | 15 |   | 33 |   |   |   | 0 | 0 |   |   |   |   |
| 3 |   | 12 |   | 14 |   | 37 |   | 12 |   | 40 |   | 2 |   | 25 |   | 16 |   |   |   | 0 | 0 |   |   |   |
| 4 | 10 |   | 13 |   | 6 |   | 13 |   | 30 |   | 11 |   | 22 |   | 28 |   |   |   |   |   | 0 | 0 |   |   |
| 5 |   | 13 |   | 29 |   | 24 |   | 6 |   | 0 |   | 13 |   | 33 |   | 0 |   |   |   |   |   | 0 | 0 |   |
| 6 | 14 |   | 0 |   | 6 |   | 25 |   | 38 |   | 2 |   | 2 |   | 23 |   | 0 |   |   |   |   |   | 0 | 0 |
| 7 |   | 0 |   | 21 |   | 5 |   | 27 |   | 38 |   | 25 |   | 35 |   | 18 | 43 |   |   |   |   |   |   | 0 |

BELIEF PROPAGATION PROCESSOR

CROSS-REFERENCE TO RELATED APPLICATIONS

This application is a continuation of PCT Application No. PCT/US10/25956, titled "Belief Propagation Processor," filed Mar. 2, 2010, claiming the benefit of U.S. Provisional Application No. 61/156,792, titled "Belief Propagation Processor," filed Mar. 2, 2009, and U.S. Provisional Application No. 61/293,999, filed Jan. 11, 2010. These applications are incorporated herein by reference.

This application is related to, but does not claim the benefit of the filing date of, U.S. Provisional Patent Application Ser. No. 61/156,794, titled "Circuits for Soft Logical Functions," filed Mar. 2, 2009, and U.S. Provisional Patent Application Ser. No. 61/156,721, titled "Signal Mapping", filed Mar. 2, 2009, and U.S. Provisional Patent Application Ser. No. 61/156,735, titled "Circuits for Soft Logical Functions," filed Mar. 2, 2009. This application is also related to, but does not claim the benefit of the filing date of, U.S. application Ser. No. 12/537,060, titled "Storage Devices with Soft Processing," filed Aug. 6, 2009. The contents of the above applications are incorporated herein by reference.

STATEMENT AS TO FEDERALLY SPONSORED RESEARCH

This invention was made with government support under FA8750-07-C-0231 awarded by the Defense Advanced Research Projects Agency (DARPA). The government may have certain rights in this invention.

BACKGROUND

This document relates to an analog belief propagation processor.

"Belief Propagation" (BP) is an efficient approach to solving statistical inference problems. The approach exploits underlying structure of a network of stochastic elements and its constraints and Bayesian laws of probabilities to find the most optimal set of valid outputs that satisfy constrains and network structure requirements.

Belief Propagation includes a class of techniques for performing statistical inference using a system model that is in the form of a graph. The term "graph" here refers to the mathematical definition of a graph, which represents the connectedness of a set of abstract objects. The objects are often referred to as "nodes" and the connections between objects are often referred to as "edges." One common type of graph used in such models is referred to as a "factor graph." In a factor graph (a particular style of factor graph called a "Forney factor graph") the nodes represents statistical relationships between values, which are represented as edges. Other types of graphs, such as Bayesian networks, and Markov random fields are also commonly used for statistical inference.

Examples of Belief Propagation approaches operate by passing messages between nodes in the graph, where each message represents a summary of the information known by that node through its connections to other nodes. Such approaches are known by various names, including belief propagation, probability propagation, message passing, and summary-product algorithms, among others. Particular forms of these approaches include sum-product, max-product, and min-sum.

A large variety of approaches to coding, signal processing, and artificial intelligence may be viewed as instances of the summary-product approach (or belief/probability propagation approach), which operates by message passing in a graphical model. Specific instances of such approaches include Kalman filtering and smoothing, the forward backward algorithm for hidden Markov models, probability propagation in Bayesian networks, and decoding algorithms for error correcting codes such as the Viterbi algorithm, the BCJR algorithm, and the iterative decoding of turbo codes, low-density parity check codes, and similar codes.

Graphs on which belief propagation may operate include two types: graphs with loops (cyclic graphs) and graphs with no loops (acyclic graphs). Graphs with no loops are also known as "trees." Belief propagation procedures differ fundamentally between these two types of graphs. For a tree, belief propagation approach can proceed in a well-defined order with a well-defined number of steps to compute the result. And assuming ideal computation, this result is always known to be correct. For a graph with loops, on the other hand, belief propagation approaches are generally iterative, meaning the same set of computations must be repeated successively until a result is reached. In this case, the computation typically converges to a useful result, but does not always do so. In some cases, the computation may not converge to a single result, or if it does, the result in some cases is inaccurate. For a cyclic graph, the performance of belief propagation can depend on the order in which the computations are performed, which is known as the message passing 'schedule.'

In one particular application mentioned above, Belief Propagation has been adopted as an efficient method of implementing decoders for various forward error correcting codes. In this case BP uses structure of the code and constraints to infer the correct valid codeword from the input codeword that contains noise, for instance, with each element (e.g., bit) of the input codeword being represented as a distribution rather than a discrete value. In some implementations of Belief Propagation for forward error correction a Digital Signal Processor is used to perform various arithmetic computations required by the algorithm with all the statistical data being processed in digital format.

Observing the fact that "soft"—probabilistic data is continuous in nature, i.e., represented by real values in a finite interval, it is possible to implement belief propagation algorithm using analog electrical circuits. Since only one signal is associated with the unit of statistical data rather than multiple signals for different digits (e.g., binary digits, bits) of the digital signal representing the same data, the savings in hardware and power dissipation can be very significant.

Several architectures had been proposed that utilize analog circuits to perform efficient decoding of various codes, including convolutional codes, Low Density Parity Check Codes (LDPC) or linear block codes. These include analog implementations that use a so-called full flat architecture, where each input data symbol is associated with dedicated computing element.

SUMMARY

In one aspect, in general, an analog processor has a first memory module and a second memory module. The first memory module is for storing a first set of storage values in respective storage elements each representing a respective input to the processor. The second memory module is for storing a second set of storage values in analog form in respective storage elements. The second set of storage values includes intermediate values determined during operation of the processor. The analog processor also includes an analog computation module coupled to the first and the second memory modules. This processor is configurable such that in each of a set of operation cycles the analog module determines values for at least some of the second set of storage values based on at least some of the first and the second sets of storage values. An output module is use for generating a set of outputs from at least some of the second set of storage values.

Aspects may include or more of the following features.

The first storage module is configured to store the first set of storage values in analog form.

The analog computation module is linked to the first and the second memory modules via analog signal paths. For example, the analog signal paths are each configured to carry a value on a conductor represented as at least one of a voltage and a current proportional to the value.

The analog module is configurable to determine values for a different subset of the second set of storage values in each of a plurality of operation cycles.

The processor includes input selection circuitry configurable to couple the analog computation module to outputs of selected memory elements of the first and the second memory modules.

The processor further includes, for each analog computation module, a plurality of signal busses, each bus providing an input value to the analog computation module and being switchably coupled to a plurality of the storage elements of the second memory module.

The storage elements are coupled to switchably provide a current representation of a storage value stored in the storage element such that the input value provided to the analog computation module is represented as a current that is substantially proportional to a sum of the currents representations provided by the storage elements.

The processor further include output section circuitry configurable to accept outputs of selected memory elements of the first and the second memory modules, and to determine outputs of the analog processor.

The processor includes multiple analog computation modules being concurrently operable to determines values for different subsets of the second set of storage values in each operation cycle.

The second memory module includes a plurality of section, each associated with a corresponding different one of the analog computation modules for storing values determined by the associated computation module.

The second memory module is configured such that in a single operation cycle, each storage element can provide a storage value to one or more of the analog computation modules and can accept a determined value to storage in the storage element for providing in a subsequent operation cycle.

Each storage element is associated with two storage locations such that in any one cycle, one storage location is used for accepting a determined value and one storage location is used for providing a value.

The second memory module includes multiple memory sections. Groups of the sections form banks, wherein for each of the analog computation modules each of a set of inputs to the module is associated with a different bank of the memory sections.

The processor is configured to implement a belief propagation computation.

The processor of claim is configured to implement a factor graph computation.

The processor is configured to implement a decoder for a low density parity check (LDPC) code.

The processor further includes a controller configured to control operation of the processor to perform a set of iterations of computation, each iteration comprising a set of computation cycles.

The set of computation cycles is substantially the same in each iteration, each cycle being associated with a configuration of the first and the second storage modules to provide inputs and output to one or more analog computation modules.

The processor is configured and/or configurable to implement a decoder parity check code, and each cycle is associated with one or more parity check constraints, and wherein the cycles of each iteration are together associated with all the parity check constraints of the code.

The analog computation module implements a network of analog processing elements.

The analog processing elements include elements that represent soft logical operations. For example, the soft logical operations include soft XOR operations.

The network of elements is acyclic.

The network of elements includes at least one cycle of elements, the analog computation module being configured to implement an relaxation computation.

In another aspect, in general, a decoder includes a first memory for storing code data having a length in bits, and a second memory for storing intermediate data in analog form. The decoder includes an analog decoder core coupled to the first memory and to the second memory. The decoder core has an input length less than the length of the code data and an output length less than a number of constraints represented in the code data. The decoder further includes a controller for, in each of a set of cycles, coupling the inputs of the decoder code to selected values from the first and the second memories, and coupling outputs of the decoder core for storage in the second memory. An output section of the decoder is coupled to the second memory for providing decoded data based on values stored in the second memory.

In another aspect, in general, a method is used for forming a data representation of an analog processor. The method includes forming: a data representation of a first memory module for storing a first set of storage values in respective storage elements each representing a respective input to the processor; a data representation of a second memory module for storing a second set of storage values in analog form in respective storage elements, the second set of storage values including intermediate values determined during operation of the processor; a data representation of an analog computation module coupled to the first and the second memory modules, the processor being configurable such that in each of a set of operation cycles the analog module determines values for at least some of the second set of storage values based on at least some of the first and the second sets of storage values; and a data representation of an output module for generating a set of outputs from at least some of the second set of storage values.

In some examples, forming the data representations includes forming Verilog representations of the processor.

The method can further include fabricating a integrated circuit implementation of the analog processor according to the formed data representation.

In some examples, the method further includes accepting a specification of a parity check code and forming the data representations to represent an implementation of a decoder for the code.

In another aspect, in general, software stored on a computer readable medium includes instructions for and/or data imparting functionality when employed in a computer component of an apparatus for forming an integrated circuit implementation of any of the analog processor described above.

In another aspect, in general, decoding method includes, in each of a series of cycles of a decoding operation, applying a portion of code data and a portion of an intermediate value data to an analog decoder core, and storing an output of the decoder coder in an analog storage for the intermediate data. Data, including intermediate value data from the analog storage, are combined to form decoded data representing an error correction of the code data.

In some examples, each of the series of cycles is associated with a corresponding subset of less that all of a plurality of parity-check constraints of the code. The intermediate value data may include values each associated with a different one of the parity check constraints of the code.

In another aspect, in general, a processor includes a first memory module for storing a first set of storage values each representing a respective input, and a second memory module for storing a second set of storage values in analog form. An analog module is coupled to the first and the second memory modules. The analog module is configured to, in each operation cycle of at least one iteration, update at least some of the second set of storage values based on the first and the second sets of storage values. An output module is for generating a set of outputs from at least some of the second set of storage values.

The analog module may be configured for updating a different subset of the second set of storage values in each of at least two operations cycles of an iteration.

The analog module may include a set of distributed components each configured to update a different subset of the second set of storage values using a different subset of the first set of storage values and the second set of storage values.

In another aspect, in general, a decoder includes a first memory for storing code data having a length in bits, and a second memory for storing intermediate data in analog form. An analog decoder core is coupled to the first memory and to the second memory, the decoder core having an input length less than the length of the code data and an output length less than a number of constraints represented in the code data. A controller in the decoder is for, in each of a plurality of cycles, coupling the inputs of the decoder code to selected values from the first and the second memories, and coupling outputs of the decoder core for storage in the second memory. An output section is coupled to the second memory for providing decoded data based on values stored in the second memory.

In another aspect, in general, a decoding method includes, in each of a number of cycles of a decoding operation, applying a portion of code data and a portion of an intermediate value data to an analog decoder core, and storing an output of the decoder coder in an analog storage for the intermediate data. Data, including intermediate value data from the analog storage, is then combined to form decoded data representing an error correction of the code data.

Advantages of one or more aspects may include the following:

Use of analog computations and/or analog storage of intermediate values provides lower power and/or smaller circuit area implementations as compared to a digital implementations, for instance in applications of iterative decoding or error correcting codes.

Iterative use of one or more analog computation cores provides lower power and/or smaller circuit area as compared to fully parallel relaxation implementations of similar decoding algorithms. In some examples, a partially relaxation implementation in which parts of a computation are implemented in relaxation from in each of a succession of cycles may also provide similar advantages over a fully parallel relation implementation.

Approaches are applicable to decoding of block codes without requiring that the size and/or power requirements of an implementation grow substantially with the length of the code.

Other features and advantages of the invention are apparent from the following description, and from the claims.

DESCRIPTION OF DRAWINGS

FIG. 9 is a table that specifies inputs and outputs for the shared module shown in

FIG. 8;

DESCRIPTION

Figure 1:
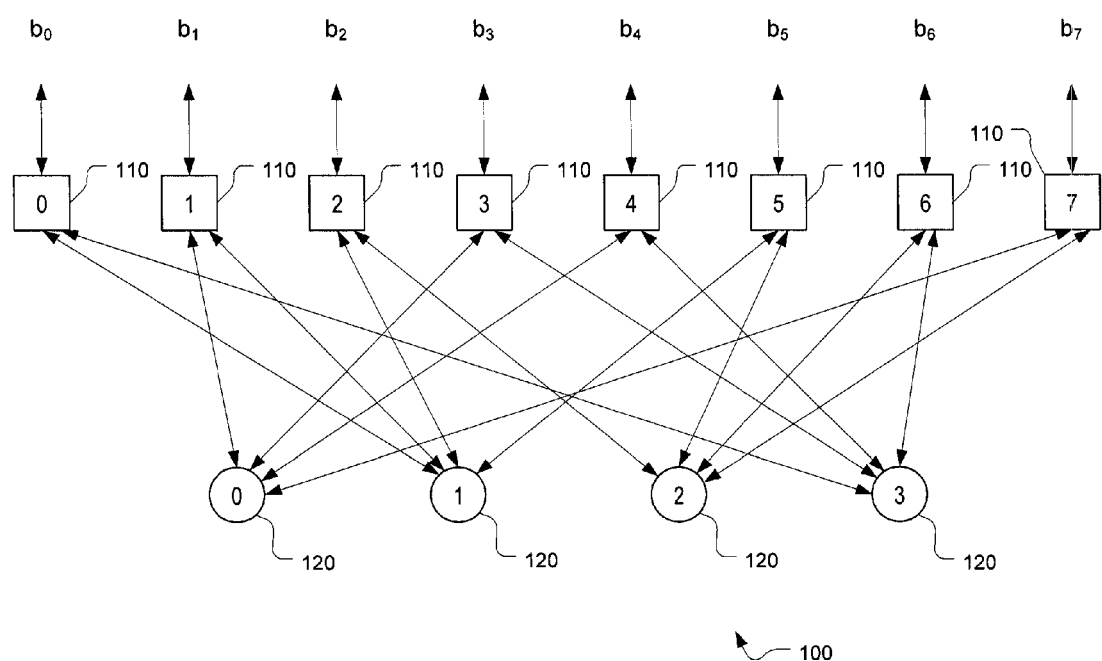
FIG. 1 is an example factor graph for a length 8 LDPC code.

Referring to FIG. 1, in one example of an analog-based implementation of a belief propagation processor, a decoder for a Low Density Parity Check (LDPC) code is based on a factor graph 100 in which one variable node 110 is associated with each different input bit ($b_j$), and one check (constraint) node 120 is associated with each constraint. In FIG. 1, an example with eight input bits with four checks (constraints) on the input bits is shown. The code can be represented in matrix form in which each column is associated with a different input bit, and each row is associated with a different check or constraint. An (i, j) entry is 1 if the $j^{th}$ input is used in the $i^{th}$ constraint and 0 otherwise. In the LDPC example, the constraint is that the XOR of the inputs for a constraint is 0.

This example length 8 LPDC code can be represented according to the following check matrix (note that the rows are dependent modulo 2 in this illustrative example, which is not necessarily true in general):

$$\begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix}$$

Figure 2A:
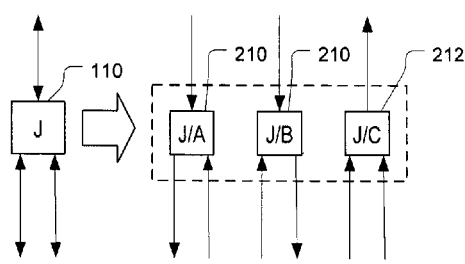
FIG. 2A is a diagram that illustrates transformation of a variable node with bidirectional links to a set of variable nodes with directed links.
Figure 2B:
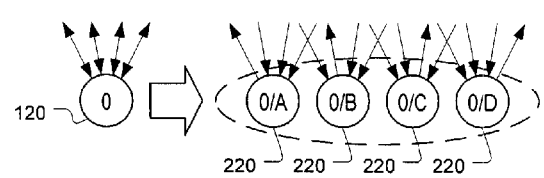
FIG. 2B is a diagram that illustrates a similar transformation for a constraint node.

In FIG. 1, each edge is bidirectional. Referring to FIGS. 2A-B, an equivalent directed (unidirectional) graph can be formed by replacing each n-edge node with n separate nodes, each of the n nodes having n−1 inputs and one output, and forming unidirectional edges between the nodes to achieve the connectivity of the original graph. Referring to FIG. 2A, for instance, each 3-edge variable node 110 can be replaced with three 2-input/1-output variable nodes 210, 212. Referring to FIG. 2B, each 4-edge check node 120 can be replaced with four 3-input/1-output check nodes 220.

Figure 3:
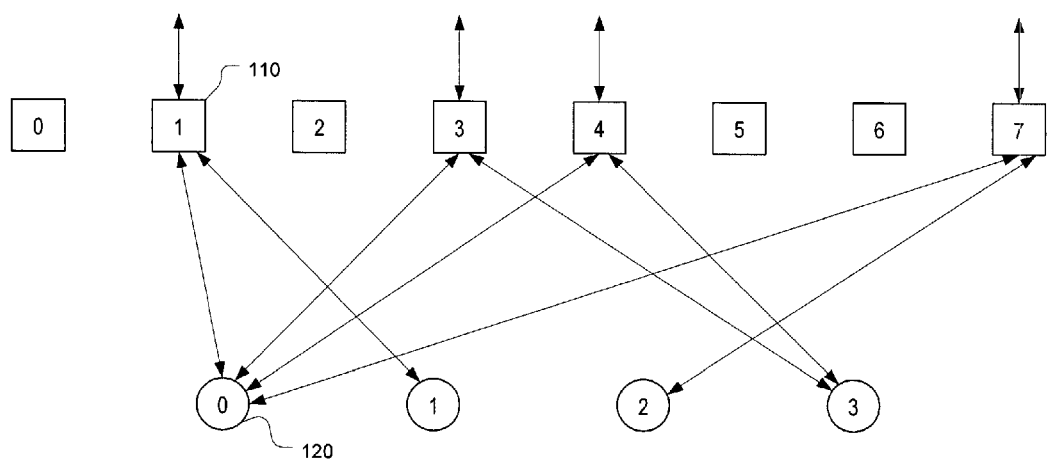
FIG. 3 is a portion of the graph shown in FIG. 1.
Figure 4:
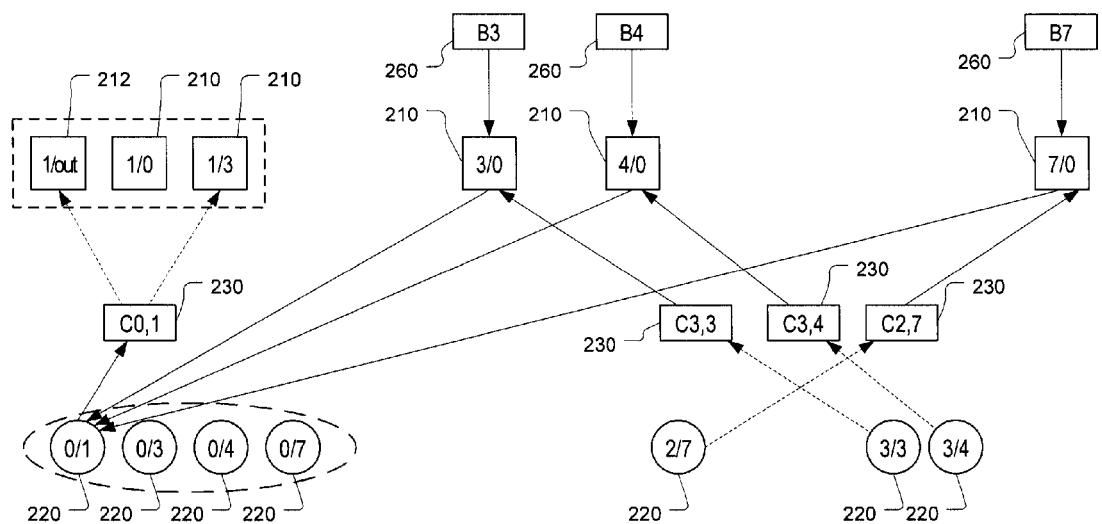
FIG. 4 is a portion of a directed graph corresponding to the portion of the bidirectional graph shown in FIG. 3.

One approach to analog implementation of a decoder corresponding to the factor graph shown in FIG. 1 is to implement a circuit element for each node of the equivalent unidirectional graph. Referring to FIG. 3, a portion of the graph shown in FIG. 1 is illustrated showing check node 0 (120), the bidirectional edges and variable nodes 1, 3, 4 and 7 (110) linked to that check node, as well as the other check nodes 1, 2 and 3 (120) linked to those variable nodes. Referring to FIG. 4, a portion of the corresponding directed graph is shown in which check node 0 (120) is expanded as four 3-input/1-output check nodes 220, for instance, labeled "0/1" to indicate that this is part of the expansion of check node 0 with the output link coupled to variable node 1. Similarly variable node 1 (110) is shown in its expansion into three 2-input/1-output nodes 210, 212, for instance, labeled "1/0" to indicate that this is part of the expansion of variable node 1 with the output link coupled to check node 0, or labeled "1/out" to indicate that the output link provides an output of the factor graph.

In the example, which is partially illustrated in FIG. 4, a full implementation has four circuit elements for each check node (i.e., 16 total expanded unidirectional check nodes 220), and three circuit elements for each variable node (i.e., 24 total expanded unidirectional variable nodes 210, 212). Out of the three circuit elements for a variable node, two (i.e., 16 total expanded variable nodes 210 for all variable nodes) are used for message passing in an iterative stage of decoding operation, and one (i.e., 8 total expanded variable nodes 212 for all variable nodes) is used for generating the decoder output (i.e., the "belief") in an output stage of decoding operation, as will be described further below.

In operation, input signals $y_i$ are used to determine corresponding analog representations of input messages, which may be determined in a signal mapping circuit. In some examples, the inputs messages form representations of the probabilities corresponding to bits $b_i$, but the reader should recognize that the discussion below with respect to computations involving representations of bit probabilities is illustrative of a particular form of input and internal messages that are stored or passed during computation. These messages are provided to the inputs of the variable nodes 210, for example, as outputs of analog input registers 260. As discussed further below, in some embodiments the representations of the bit probabilities are provided as analog signals from the input registers 260 encoding a (prior) log likelihood ratio (LLR) which is typically of the form $$\log\left(\frac{Pr(b_i = 0 \mid y_i)}{Pr(b_i = 1 \mid y_i)}\right),$$

In the case of equal prior bit probabilities $P(b_i=0)=P(b_i=1)$ is equal to $$\log\left(\frac{P(y_i \mid b_i = 0)}{P(y_i \mid b_i = 1)}\right).$$

In some examples, these bit probabilities are encoded as voltage or current in single-ended or differential form (e.g., using a pair of conducting paths for each unidirectional signal).

The approach partially illustrated in FIG. 4 is one of a number of approaches to implementation of a decoder corresponding to the graph shown in FIG. 1 that involve introducing an analog memory element 230 to break some or all cycles in the directed graph. In the approach shown in FIG. 4, the memory elements are introduced at the outputs of the check nodes. Other versions have such memory elements introduced at the output of the variable nodes instead of or in addition to the memory elements at the outputs of the check nodes. Note that in yet other embodiments, some or all cycles remain without memory elements, and operation is at least partially based on a "relaxation" form of computation as signals propagate through the cycles. In some embodiments, as combination of relaxation and memory based computation is used.

As illustrated in the example partially illustrated in FIG. 4, memory elements 230 in this embodiment store values in analog form, and are introduced at each output of the check nodes 220; that is, 16 memory elements are introduced. For notational simplicity, these locations are indexed as (i, j) and labeled "Ci,j", for the output from check node i that is linked to variable node j. Note that each location corresponds to one of the non-zero entries in the check matrix of the code. The (i, j) memory location corresponds to the row i, column j, non-zero entry of the check matrix of the code.

In a number of approaches that make use of analog memory elements, the memory is introduced in the circuit implementation of the graph such there remain no cycles in the directed graph by breaking all cycles in the directed graph. The circuit implementation is then operated in a series of clocked cycles, such that at each cycle analog values read from some or all of the analog memory elements are propagated through analog circuit elements to inputs of some or all of the memory elements where they are stored at the end of the clock cycle. As discussed in detail below, such clocked ("discrete time") implementation can be used to decode with a result that is similar to that which would result from a relaxation ("continuous time") implementation.

Figure 5:
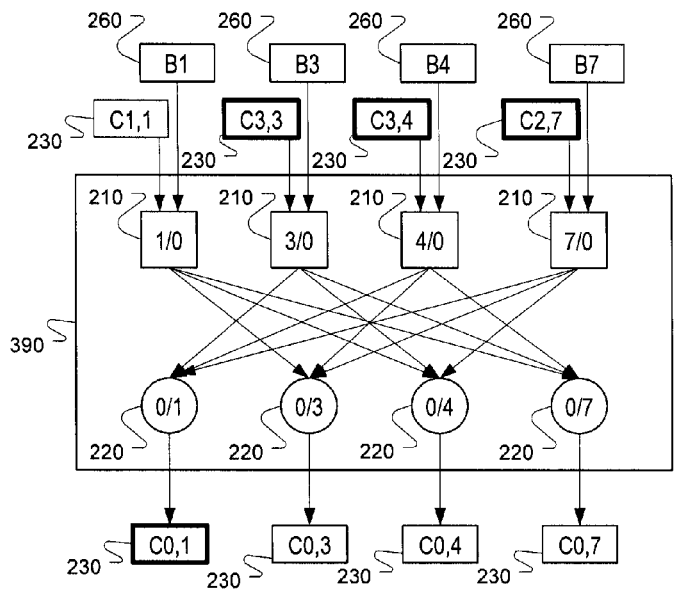
FIG. 5 is a diagram illustrating a module implementation corresponding to the portion of the graph shown in FIG. 4.
Figure 7A:
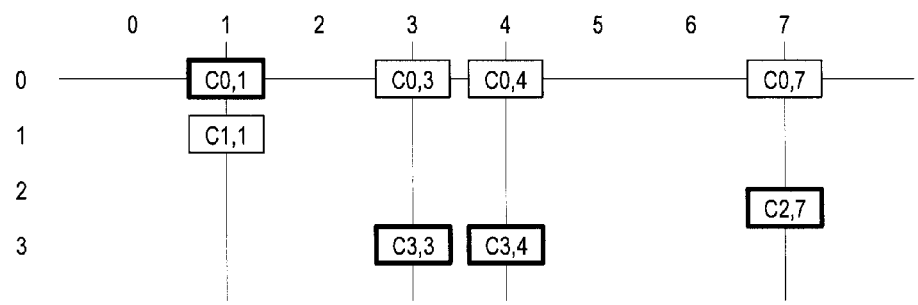
FIG. 7A is a diagram that shows a relationship between input and outputs or a module.
Figure 7B:
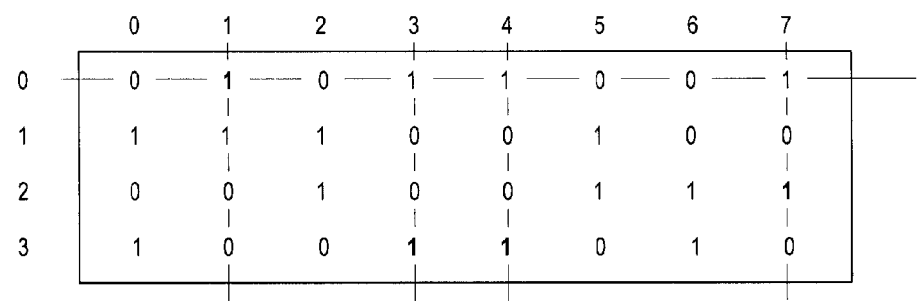
FIG. 7B illustrates the corresponding code matrix.

Referring to FIG. 5, another partial illustration of the example shown in FIG. 4 includes outputs of the four expanded check nodes 220 associated with the original check node 0 (120). A circuit block 390 forms an analog computation module that includes implementations of the expanded variable nodes 1/0, 3/0, 4/0, and 7/0 (210) which have outputs to the four expanded check nodes 220. Note that check node 0 corresponds to row 0 of the matrix representation of the code, which is reproduced in FIG. 7B. Note that the outputs of the circuit block 390 correspond to the memory locations row 0 of the matrix representation, as illustrated in FIG. 7A. The inputs of the circuit block 390 correspond to the non-zero entries in each column of the matrix representation that has a non-zero entry in row 0, omitting those entries in row 0. In this illustration, the inputs correspond to the non-zero entries in columns 1, 3, 4 and 7 in rows 1, 2 and 3. This results in four memory cell inputs, C1,1, C3,3, C3,4 and C2,7, in addition to the inputs from the input bit probabilities, B1, B3, B4, and B7.

An example of a full clocked circuit implementation of a decoder for the length 8 LDPC has a memory element 230 at the output of each unidirectional check node 220, and four copies of the circuit block 390, one corresponding to each row of the code matrix. In the first stage of decoding operation, each unidirectional variable node 210 (i.e., a total of 16 circuit elements) takes its input from an output of a memory element 230, and one of the input bit probabilities 260. (Note that in general for other size codes, the variable nodes are associated with more than two check nodes, and therefore variable nodes would take as input values from multiple memory elements). The memory cells 230 as a whole form a memory that is configured so that effectively all the values are updated at once at the end of each clock cycle. One implementation of such a memory uses a "double buffering" approach in which two banks of memory are used, and in each clock period, one bank is read from and the other bank is written to, with the banks switching role between each clock period.

In some examples, the decoder may perform memory updates in successive clock cycles, each clock cycle corresponding to a full update of all memory cells of the memory 250. The number of clock cycles to be performed in the first stage of decoding operation may be pre-determined, for example, based on design preference, or depend upon the satisfaction of certain convergence conditions, for example, satisfaction of the code constraints (i.e., full error correction) or a condition based on a rate of change of output values between iterations.

Figure 6:
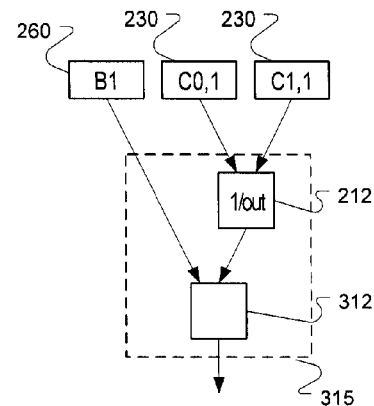
FIG. 6 is a diagram illustrating output calculation.

Referring to FIG. 6, in some examples, once the iterations of memory updates are completed, the decoder proceeds to the output stage of decoding operation to generate decoder outputs representing bit estimates. Here, the decoder outputs are denoted as $\hat{b}_j$, each being an estimate of a corresponding input bit ($b_j$) based on the entire input signal. In some examples, as illustrated in FIG. 6, the variable node 212 outputs a message that includes a representation of the bit probability after decoding, for example, as an LLR, which can be considered to approximate $$\log\left(\frac{P(b_i = 0 \mid y_{\backslash i})}{P(b_i = 1 \mid y_{\backslash i})}\right)$$

where $y_{\backslash i}$ denotes the observations not including $y_i$. The output of variable node 212 is combined in a combination element 312 with the input bit probability representation from input register 260 to form the representation of the bit probability based on all the inputs and the constraints between the decoded bits. Recall that the output of input register 260 can be considered to represent $$\log\left(\frac{Pr(b_i = 0 \mid y_i)}{Pr(b_i = 1 \mid y_i)}\right)$$

and therefore the combined probability output from combination element 312 is computed as a sum approximates $$\log\left(\frac{Pr(b_i = 0 \mid y)}{Pr(b_i = 1 \mid y)}\right)$$

where y represents all the input values. Optionally the combined bit probability is passed through a hard decision, which in the case of binary outputs and logarithmic representations determines $\hat{b}_j$ to take on the value of either 0 or 1 based on a thresholding of the combined log likelihood ratio as either greater or less than zero. For example, the output element that uses memory elements C0,1 and C1,1 and the input B1 to generate bit estimate $\hat{b}_1$. In some implementations, the set of eight output elements may be configured to operate in a parallel fashion to generate the full set of bit estimates $\hat{b}_j$ in a single clock cycle. Note that as illustrated in FIG. 6, elements 212 and 312 are drawn as separate. However, each effectively computes a sum of its inputs, and the two summations may be combined into a single circuit element 315.

Figure 8:
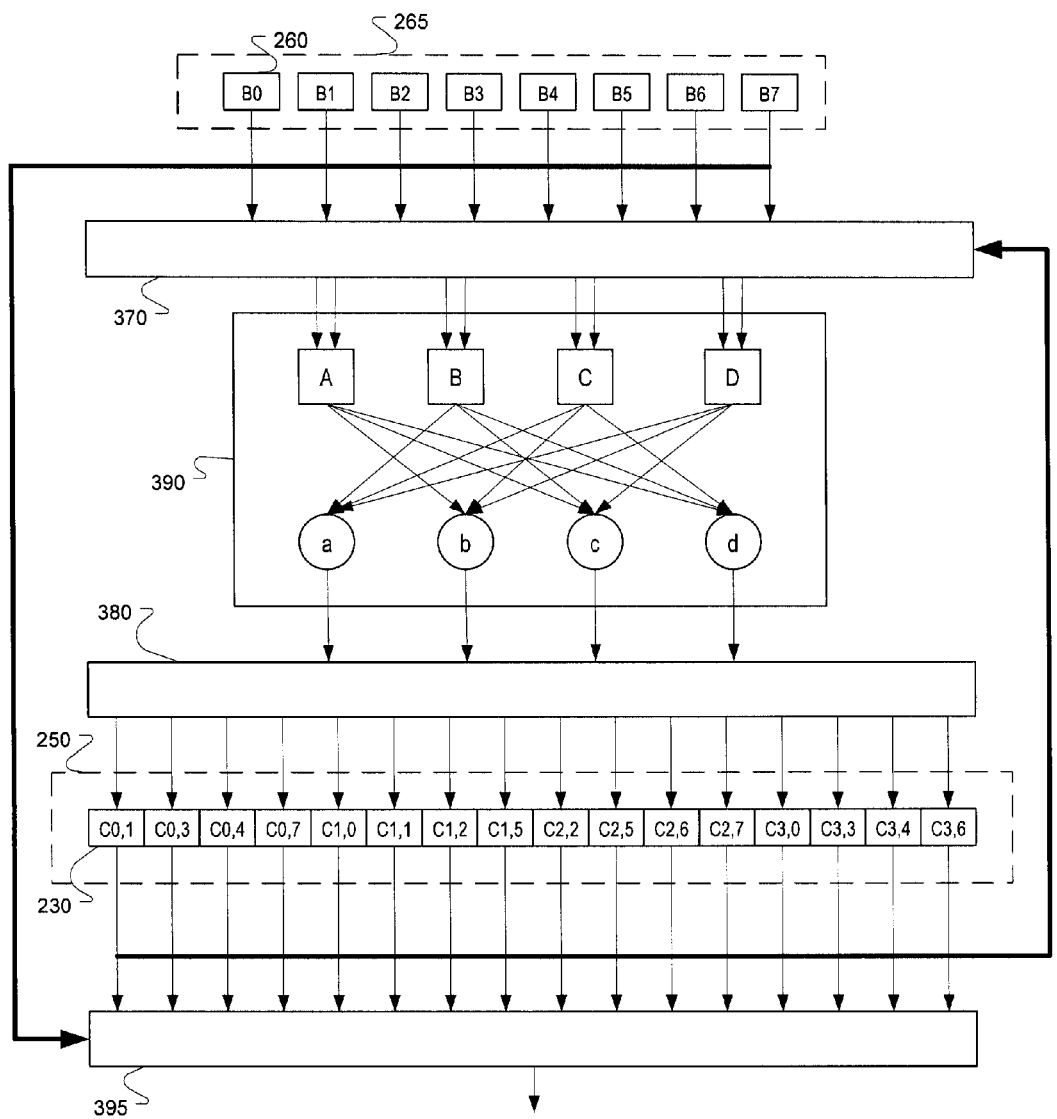
FIG. 8 is a diagram of an implementation of a decoder for a length 8 LDPC code using a shared module.

Referring to FIG. 8, in another example of a clocked circuit implementation each of the nodes of the directed graph is not required to correspond to a different circuit element. That is, certain circuit elements form analog computation modules ("cores") that are reused multiple times with different input and output connections (i.e., shared) within each iteration. The functions performed by multiple modules 390 in one clock cycle in the previous example are carried out in a series of clock cycles such that at in each of the series of clock cycles, only some of the memory elements 230 are updated, with all the memory elements being updated at the end of the series of clock cycles. Similarly, in the output stage of decoding operation, one or more shared circuit elements (e.g., element 315) may be reused in an output section 395 for generating one or more bit estimates in each of a series of clock cycles. In the discussion below, the entire series of clock cycles that updates all the memory elements in FIG. 3 is referred to as an "iteration."

Continuing to refer to FIG. 8, a shared module 390 is coupled to input selection circuitry 370 and output circuitry 380, which together provide interfaces to the memory elements 230 in the memory 250. For example, the input circuitry 370 couples each input of a variable node 210 to the output of an appropriate memory cell 230 and to an appropriate input register 260, which collectively form an input memory module 265, and the output circuitry 380 passes the outputs of the check nodes 220 to the inputs of appropriate memory cells 230, which collectively form an intermediate memory module 250. In this example, the shared module 390 includes all the variable nodes 210 and check nodes 220 needed to compute all the outputs corresponding to one of the bidirectional check nodes 120 in the factor graph illustrated in FIG. 1. During each successive clock cycle of an iteration, the input circuitry 370 and the output circuitry 380 is effectively reconfigured to change the connection of the variable nodes 210 and check nodes 220 to the memory 250 and the input bits.

As an example of a multiple cycle iteration using the shared module 390 illustrated in FIG. 8, the table shown in FIG. 9 illustrates the configurations during the four clock cycles of an iteration. Note that the configuration indicated for cycle 0 corresponds to the configuration illustrated in FIG. 5.

In some examples, multiple shared modules 390 are implemented in a single integrated circuit. For example, the example shown in FIG. 8 may be modified to have two shared modules, thereby providing eight new values for memory cells 230 in each clock cycle, with the iteration to update all the memory cells taking a total of two cycles (i.e., four constraints per iteration divided by two constraints per cycle yielding two cycles per iteration). Similarly, in some examples, a shared module may update fewer cells, for example, updating only a single cell in each clock cycle (i.e., using a single check node 220 and three variable nodes 210).

In the example illustrated above in FIG. 8, the updated values to the memory 250 are not passed through to the outputs of the memory until after the entire iteration is completed. In some examples, the updated values determined in one clock cycle may be presented at the output of the memory during subsequence clock cycles within the same iteration. In such examples, the order in which the outputs of the check nodes are computed (the "schedule") may be significant. Examples of schedules include a sequential updating of the outputs associated with each of the check nodes 120 (see the factor graph in FIG. 1), and random updating in which different nodes are updated at each clock cycle.

Figure 10:
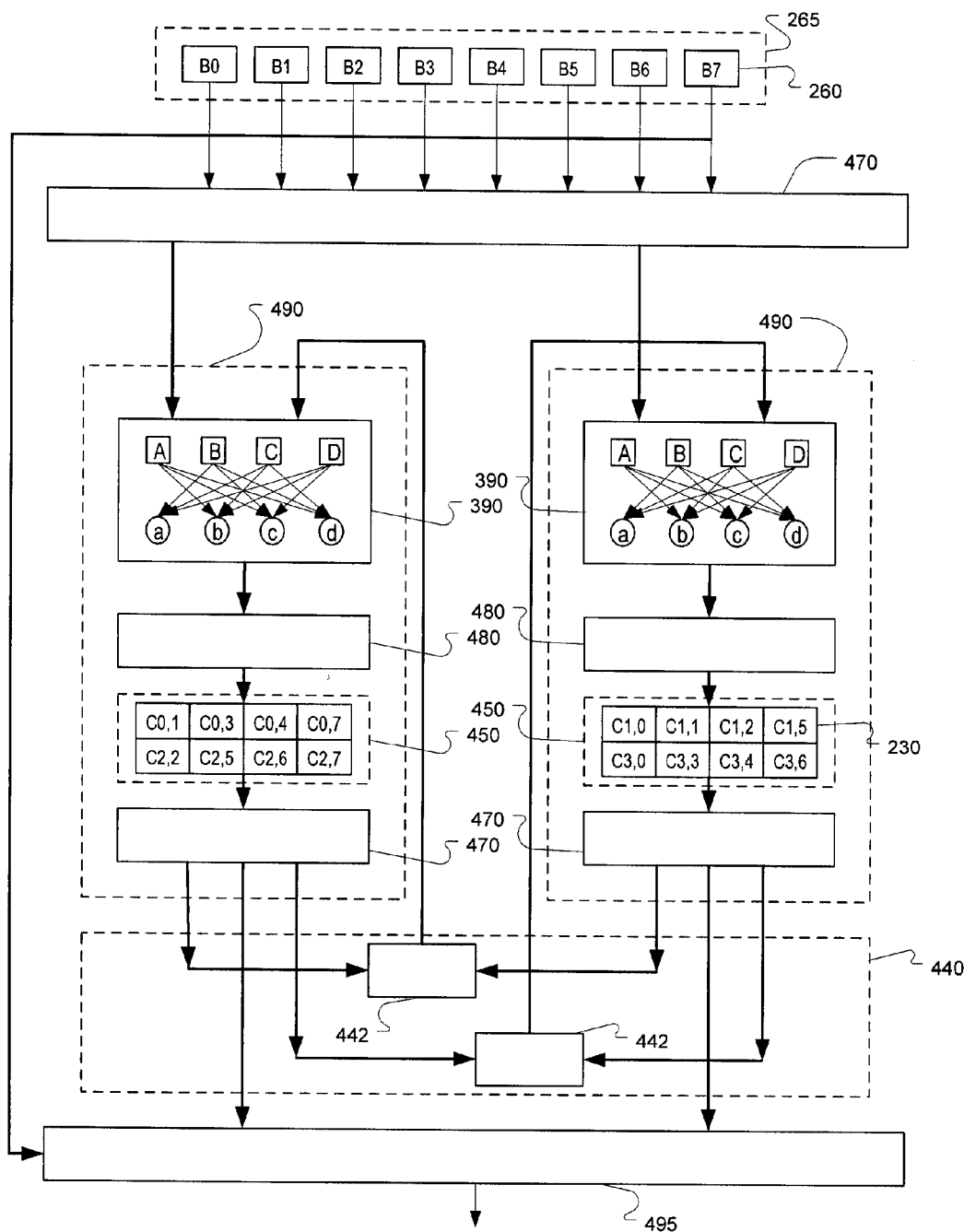
FIG. 10 is a block diagram of a decoder with two shared modules.

Referring to FIG. 10, in some examples, multiple modules 390 are used (but not a sufficient number so that an iteration may be completed in a single cycle), and the input selection circuitry 370, output selection circuitry 380, and memory 250, are distributed among a set of local processing elements 490, and each local processing element 490 has one shared module 390. Each local processing element has a local output circuitry 480 and a local input selection circuitry 470. The memory is distributed such that the memory cells 230 in the memory 450 of a local processing element are those cells that are updated by the shared module 390 in the various clock cycles of an iteration. As illustrated, each row of memory cells is updated in one clock cycle. A control input controls the configuration of the input and output circuitry according to the cycle in the iteration being performed. Note that in general, a shared module 390 at one local processing element 490 requires outputs of memory cells 230 in a local memory 470 of its own local processing element and/or another (or more generally, one or more other) local processing element. The local input selection circuitry 470 selects the memory cells required by each of the local processing elements and passes those values onto a global selection unit 440, which then determines the proper subsets of the memory values to be passed onto each one of those local processing elements. In the output stage, the memory cells are coupled through the selection circuitry 470 to the output section 495 to determine the outputs. The configuration shown in FIG. 10 can also be understood as the function of input selection logic 370 shown in FIG. 8 is distributed among blocks 470 and 442, and the output logic 380 is distributed among the blocks 480.

In some examples, the global selection unit 440 may include a set of selection units 442, each coupled to inputs of a respective local processing element to provide the corresponding subset of memory values to the shared module 390. For example, one selection unit 442 may receive 8 signals representing memory values provided by the two local input selection circuitries 470 to generate four output signals representing the memory values to be provided to the local processing element shown on the left of FIG. 10.

Referring again to FIG. 8, in some examples, the memory 250 as a whole is configured such that effectively all the values are updated exactly once in an iteration. In one implementation of such a memory using a "double buffering" approach two banks of memory are used. In iteration k, the write circuitry always writes into memory bank #1, and the read circuitry always reads from memory bank #2. By the end of iteration k, memory bank #1 has achieved a full update. In the next iteration k+1, the write circuitry switches to write into memory bank #2, and the read circuitry reads from memory bank #1 which was just updated in the last iteration.

In this case, the memory 250 would need a capacity twice the amount of the outputs from the local check nodes to keep two different copies for read and write operations respectively.

Figures 11, 12:
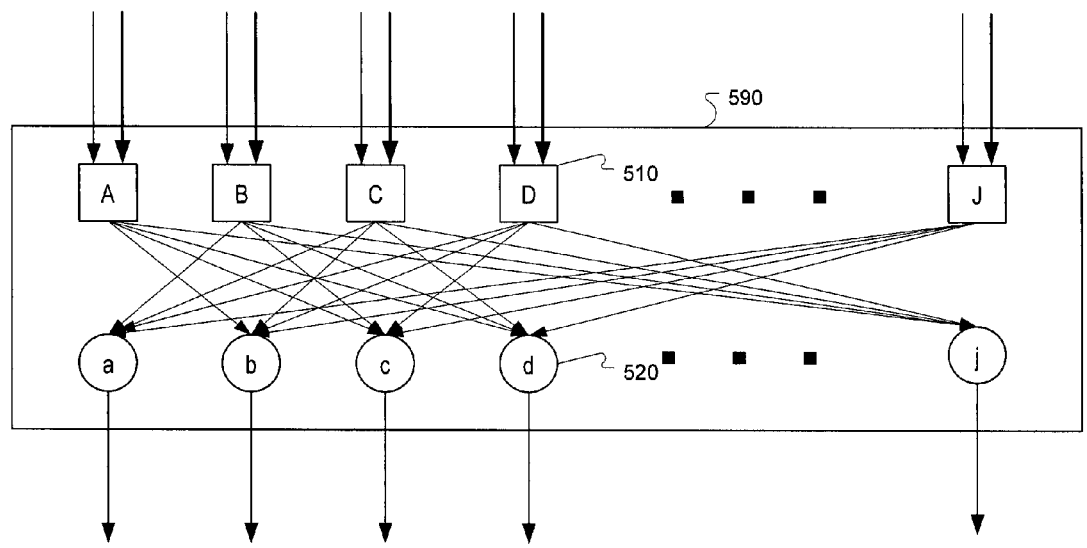
FIG. 11 is a tabular representation of a parity matrix for a (1056, 352) LDPC code.
FIG. 12 is a diagram of a shared module for use with the code shown in FIG. 11

The approaches described above in the context of a length 8 code is applicable to a larger example of an (1056,352) LDPC code, such as is used in IEEE 802.16 based communication. The check matrix of the code can be represented in tabular form breaking the 0,1 matrix into 8 rows by 24 columns of 44 by 44 blocks, with each block being either all zero, or being an shifted diagonal with one non-zero entry in each row and in each column. This tabular representation of the code is shown in FIG. 11. The upper-left (0,0) block (showing the number of "0") in the tabular representation is a diagonal matrix. The (0,2) block shown as a "8" is a off-diagonal block $M=[m_{i,j}]$ such that $m_{i,j}=1$ if $j=i+8$ (mod 44) and 0 otherwise. The full factor graph is not illustrated, but can be derived from the matrix representation in the same manner as the example illustrated in FIG. 1.

Referring to FIG. 12, a module 590 is configured to include variable nodes 510 and constraint nodes 520 for the code shown in FIG. 11. Note that the nodes illustrated in FIG. 12 are unidirectional nodes in which links are either input or output links. Module 590 is analogous to module 390 for the length 8 code discussed above. Note that each row in the code matrix shown in FIG. 11 has ten non-zero entries in all row blocks, except row block 6, which has eleven non-zero entries per block. In order to implement constraints outside row block 6, the module 590 has ten (unidirectional) variable nodes 510 and ten (unidirectional) constraint nodes 520, and for rows in row block 6, eleven (unidirectional) variable nodes 510 and eleven (unidirectional) constrain nodes 520. Each variable nodes accepts inputs for memory cells corresponding to non-zero entries in a particular column of the code matrix. Therefore, variable nodes corresponding to columns in the range 0 through 15 have four inputs (three inputs for memory cells corresponding to entries in the code matrix and one input for the bit probability) and one output. Variable nodes for columns 16 through 23 have two or three inputs depending on the column and the block row. In some examples, the module 590 has the maximum number of variable nodes and inputs necessary, and is configurable during different cycles to accommodate the specific number of variable nodes and inputs needed, for instance, by ignoring certain inputs.

Figure 13:
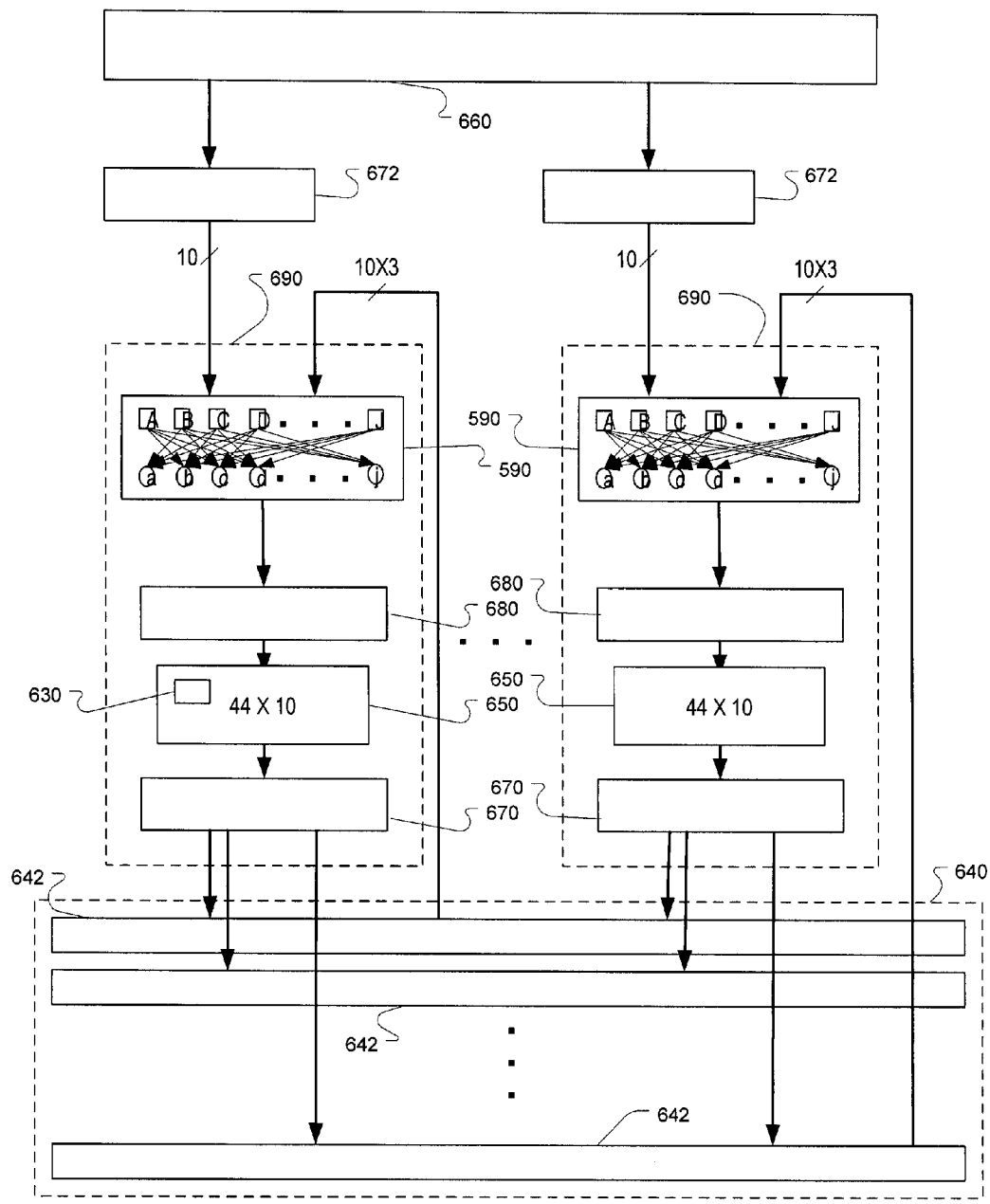
FIG. 13 is a block diagram of a decoder for a (1056, 352) LDPC code with eight shared modules (of which two are illustrated)

FIG. 13 illustrates one type of implementation of a decoder operable to perform the iterative stage of decoding operation for use with the (1056, 352) LDPC code shown in FIG. 11. In such an implementation, the decoder includes an analog input memory 660 that stores representations of the input bit probabilities (e.g., as voltages encoding log likelihood ratios) corresponding to the 1056 bits (i.e., 24 blocks of 44) of the LDPC code illustrated in FIG. 11. These input bits are then distributed by memory selection circuitry 672 to be processed in a set of local processing elements 690. Each local processing element 690 has a shared module 590 that includes the variable nodes and check nodes needed to compute all the outputs corresponding to one of the check nodes of the full factor graph. The structure of each processing element 690 is similar to each processing element 490 shown in FIG. 10 to implement the decoder for a length 8 code.

Each local processing element 690 also includes a local output circuitry 680, which directs the output of the local check nodes into appropriate cells 630 of a memory 650. In this example, the memory is distributed among the set of local processing elements 690 as a set of local memories 650, each of which includes memory cells 630 updated by the shared module 590 of its local processing element 690 (not other local processing elements) in the various clock cycles of an iteration. As described before, in general, each shared module 590 at one local processing element 690 requires outputs of memory cells in a local memory 650 of its own local processing element and/or one or more of other local processing elements. These outputs are obtained by a set of local read circuitry 670 that retrieve values from the local memory 650 and send them to a global selection unit 640, which then determines the appropriate combinations of output values to be sent to the individual local processing elements 690 at various clock cycles. The global selection unit 640 includes a separate input selection unit 642 associated with each of the local processing elements, and provides as outputs the values stored in the memories 650 required for input that that unit on each iteration.

Implementations of the type illustrated in FIG. 13 can have different numbers of processing elements, and use different schedules of applying each of the 352 constraints in different cycles of a decoding iteration. Referring back to FIG. 11 in the matrix representation of the (1056, 352) LDPC, out of the total 8 blocks of rows, rows in 7 of the blocks of rows (i.e., row blocks, 0-5, and 7) contains 10 non-zero entries, and row in one block (row block 6) each contains 11 non-zero entries. Therefore, of the 192 (i.e., 24*8) blocks of entries, only 81 are non-zero, and each of the non-zero blocks has exactly 44 non-zero entries, for a total of 3564 (81 times 44) entries.

The exemplary arrangement shown in FIG. 13 uses a set of 8 local processing elements 690 each configurable to perform the computation associated with one check node (i.e., one row), of a corresponding block of rows of the check matrix. In other words, each local processing element 690 is used repeatedly in 44 cycles to compute the outputs for the 44 constraints represented by the 44 rows of the code matrix in the corresponding block. For example, the 8 elements apply constraints 0, 44, 88, . . . , 308, respectively, on the first cycle, constraints 1, 45, 89, . . . , 309, respectively, and finally 43, 87, 131, . . . , 351, respectively, on the last cycle of an iteration.

Note that because of differences in each of the row blocks in the code matrix, the shared module 590 in each local processing element 690 may be have differences. Consider a shared module 590 for performing the computation associated with a row in the first (row block 0) block. The corresponding check node in the bidirectional graph has 10 edges linked to variable nodes. Each of the first 8 variable node has five edges, four to check nodes and one to a bit input; the $9^{th}$ variable node has four edges, three to check nodes and one to a bit input, and the $10^{th}$ variable node has three edges, two to check nodes and one to a bit input. The shared module 590 therefore has circuits for 10 (directional) check nodes, each with 9 inputs and one output. The 10 outputs of the check nodes update 10 locations in the local memory. The local processor has circuits for 10 (directional) variable nodes 510, each with four, three, or two inputs and one output. Each node 510 provided an input to 9 of the 10 (directional) check nodes 520. Of the inputs for each variable, one input is for an input bit probability and the remainder are for values from the local memories.

Shared modules 590 in the other local processing elements have the same structure as that associated with row block 0, with differences including the shared module 590 for row block 6 having 11 check nodes, and 11 variable nodes, and the share module 590 for blocks 1 through 5 each having two variable nodes with two inputs and the other variable nodes having four inputs.

In operation, at each clock cycle, the variable nodes of shared module 590 for row block 0 reads 10 sets of inputs from the input memory 660, one set for each variable node and updates 10 locations of the local memory 650. The values from memory 650 are passed through the blocks 670 of multiple of the local processing elements 690 and through the control unit 642 associated with the destination processing element. Over 44 clock cycles of an iteration, the shared module 590 provides updated values for all 440 (44 times 10) locations in the local memory.

As outlined above, in some embodiments, each one of the shared modules 590 may be implemented as a combination of 10 variable nodes and 10 check nodes (also referred to as a 10×10 shared module), except for the shared module 590 for row block 6 which is implemented as a 11×11 module.

A number of different circuit arrangements and signal encodings can be used within the approaches described above. For certain soft decoding applications, each variable node circuit can be formed using a soft Equals gate, and each check node circuit can be formed by a soft XOR gate. In the example of FIG. 13, each variable node takes the form of a 4-input (or 3-input or 2-input) soft Equals gate and each check node takes the form of a 9-input (or 10-input) soft XOR gate. Therefore, for each shared module 590, besides reading the 10 (or 11) of input bits (one each soft Equals gate) from the input memory 660, it also requires 10 (or 11) sets of values from the local memories 650 (one set for each soft Equals gate). Note that in this example these values come from the memory cells in the other local processing element(s), and not from the memory 650 in the same processing element.

One approach for providing the proper combinations of memory values needed as input to the shared modules 590 includes forming, in the global control unit 640, a set of 8 individual selection units 642, each of which selects or combines the outputs of the local processing elements 690 as needed for the input values for a corresponding shared module 590. In some examples, each one of the read circuitry 670 is selectively coupled to the set of 8 selection units, for example, using a set of 8 buses with each bus containing 10 (or 11) wires for sending a total of 10 (or 11) output values to an individual selection unit in one clock cycle. The selection unit 642 then chooses a set of 10×3 (or 11×3) output values for input to the shared module 690.

By arranging the decoder into local processing elements, in some embodiments, all of the XOR signals become local to the local processing elements in which they are formed. The inputs to the Equals gates become globally routed signals that come from multiple local processing elements. In some examples, the local processing elements 690 can be configured in a way such that each shared module 690 requires only output values from a pre-defined set of three other local processing elements. As a result, the coupling between each local processing element to the global control unit 640 can be reduced, for example, with read circuitry 670 now being coupled to only 3 (instead 8) selection units. In some examples, the local processing elements 690 can be further arranged such that all of the even-numbered (i.e., 0, 2, 4, and 6) local processing elements communicate with each other but not with the odd-numbered (i.e., 1, 3, 5, and 7) local processing elements (except for the last eight block columns of the check matrix).

Note that, in some applications relating to soft decoding, the decoder described above is used for converting input "soft" bits based on individual measurements of each bit to soft bits each based on the entire block of soft bits, taking into account the constraints that the original bits of the block satisfied. These output soft bits can then be further processed, or converted by hard decision into output "hard" bits taking values 0 or 1. The input soft bits may be provided in the probability domain, for example, as the probability of a bit being value of 1 or 0. Alternatively, the input soft bits may be provided in the log domain, for example, as the log likelihood ratio of a bit (e.g., as defined by $$\log\left(\frac{p(b_i = 0 \mid y_i)}{p(b_i = 1 \mid y_i)}\right).$$

In either case, the shared module 590 can be implemented using a set of analog circuit components that perform analog computation functions appropriate for the particular application. Implementations of some of these analog circuit components (such as soft Equals and soft XOR) are illustrated in detail in U.S. Patent Application Ser. No. 61/156,794, titled "Circuits for Soft Logical Functions," filed Mar. 2, 2009.

Figure 14:
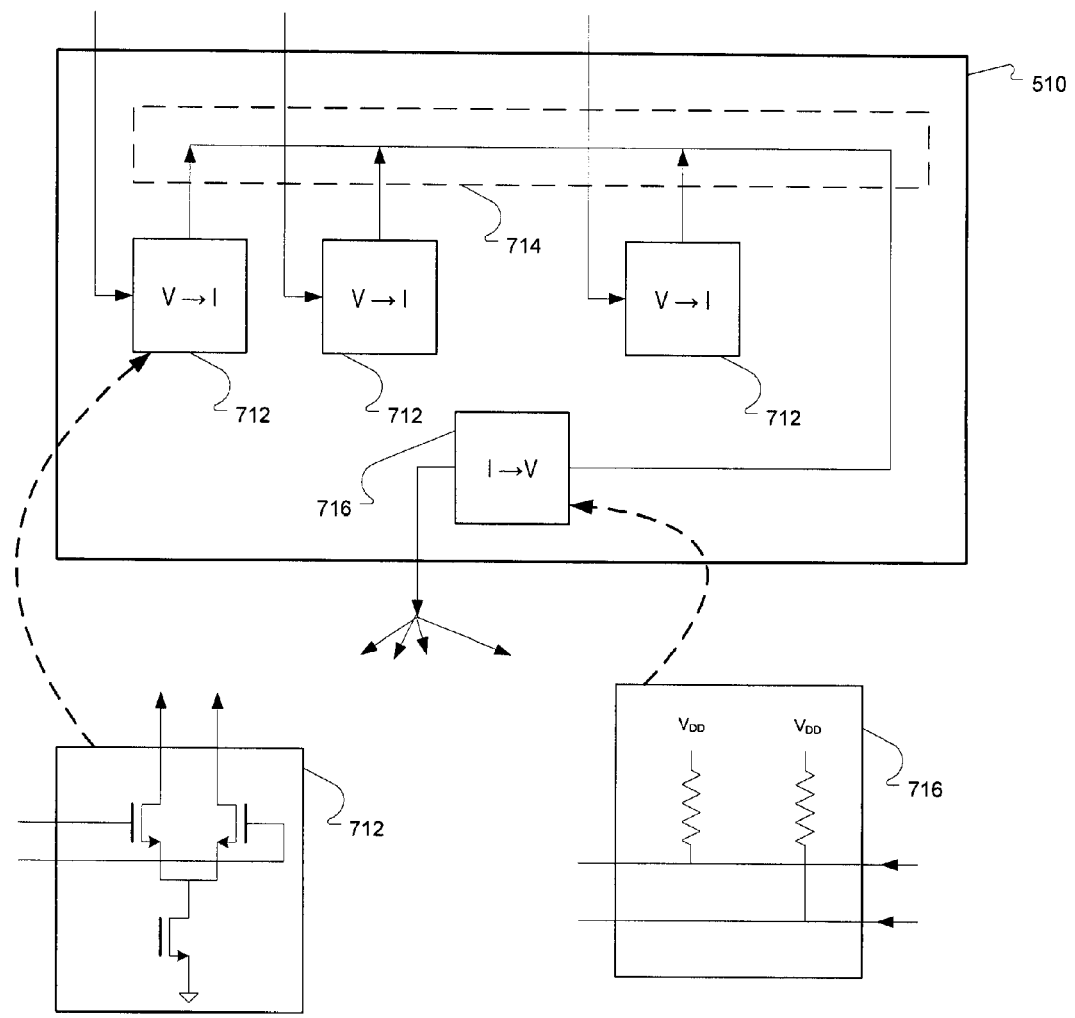
FIG. 14 is a circuit implementation of a variable node.

Referring to FIG. 14, in some implementations, the soft equals makes use of differential voltage inputs, each representing a log likelihood ratio to produce a voltage that is proportional to the sum of the inputs. Each differential voltage input is passed through a voltage to current converter 712, and the resulting currents are summed on a bus 714. The current on the bus is passed through a current to voltage converter 716. The output voltage then branches to the soft XOR circuits that require the output of this equal node. Exemplary circuit implementations are shown in the figure. A variety of alternative circuits can be used, including alternative soft Equals circuits described in U.S. Patent Application Ser. No. 61/156,794.

Figure 15A:
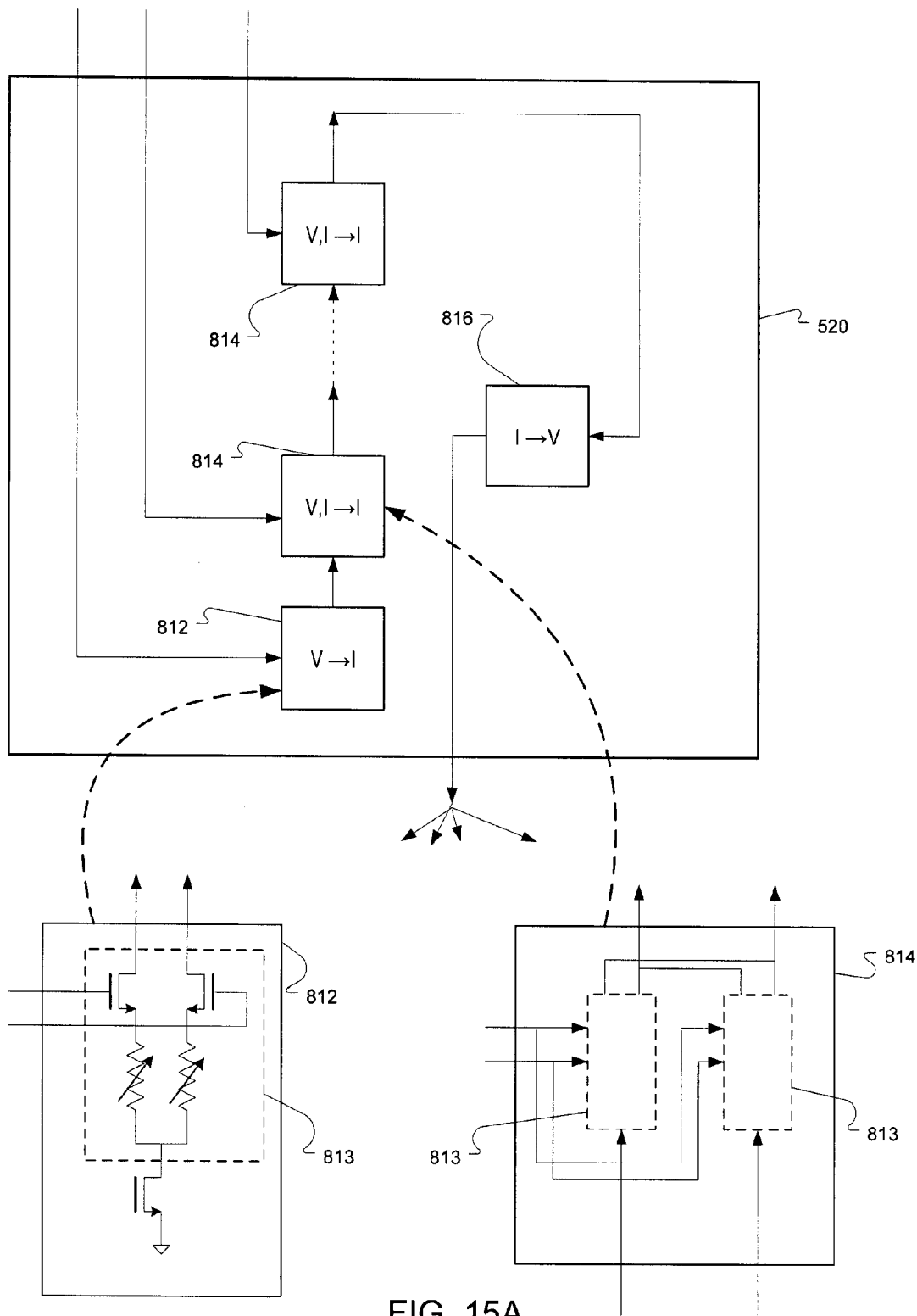
FIG. 15A is a circuit implementation of a constraint node.

Referring to FIG. 15A, in some implementations, the soft XOR circuits make use of log domain differential voltages as produced by the circuit shown in FIG. 14. In the exemplary implementation of the soft XOR circuit shown in FIG. 15A, which approximates an ideal soft XOR function for log domain processing, one differential voltage input is passed to a circuit 812. The second and further inputs to the soft XOR circuit are passed to circuits 814, each of which performs an analog computation that approximates multiplication of the current provided by the previous element according to that input. The resulting current approximates the ideal soft XOR function each of the inputs and is passed through a current to voltage converter 816, to provide the differential voltage output of the soft XOR. Note that unlike the soft Equals circuit shown in FIG. 14, the output of the overall soft XOR circuit does not fan out on any particular cycle, because the output of the soft XOR circuit provides the input to only a single memory cell. The circuit parameters, for instance, resistance values, transistor dimensions, and voltage scaling, are chosen to best approximate the ideal function of a soft XOR and/or to optimize higher level (e.g., overall decoding) system performance.

Figure 15B:
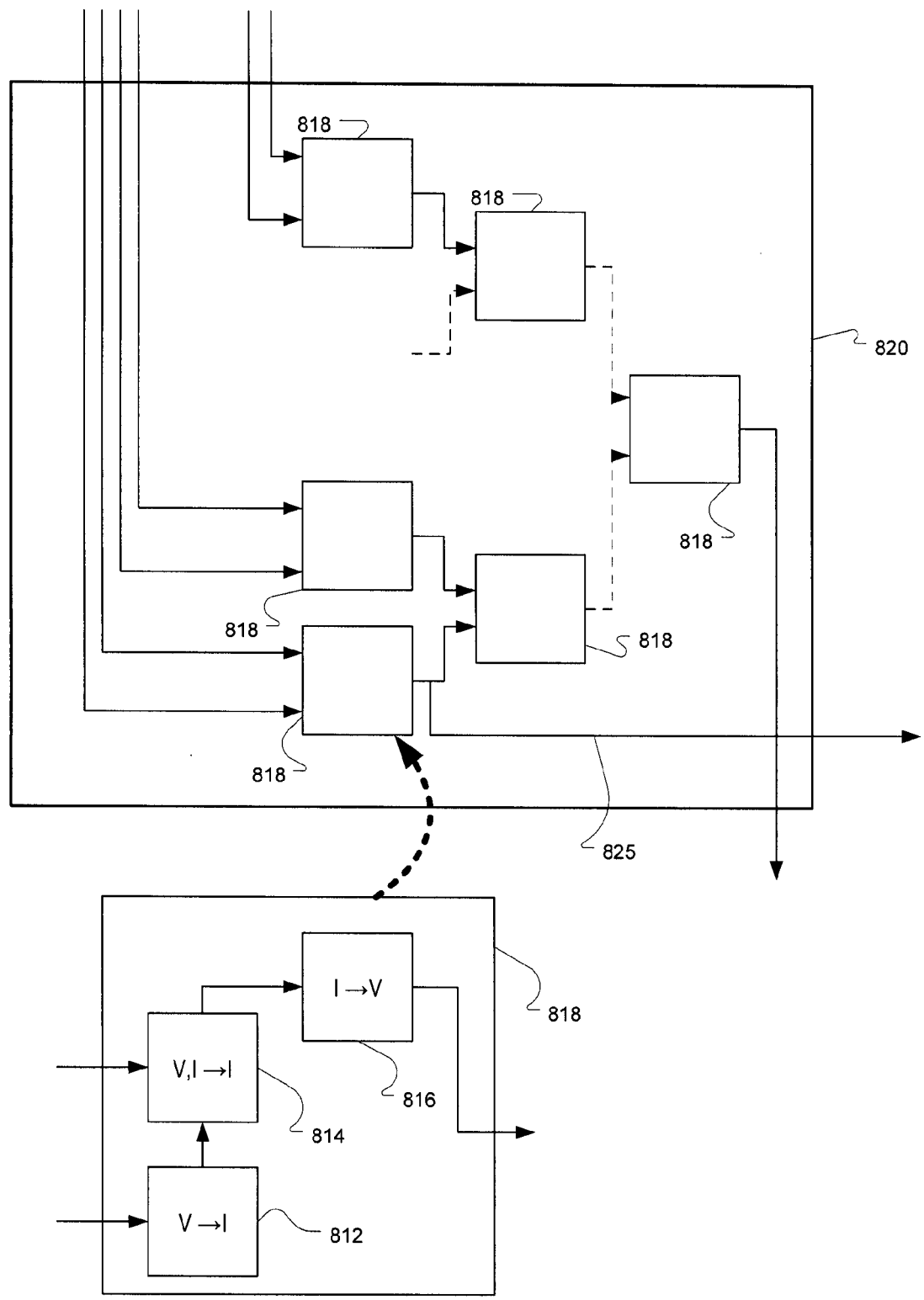
FIG. 15B is an alternative implementation of a constraint node.

Referring to FIG. 15B, an alternative arrangement 820 of circuit elements to the soft XOR circuit 520 shown in FIG. 15A implements the directional soft XOR circuit using a branching tree structure, optionally sharing signals between different trees associated with a same bidirectional check node. Specifically, groups of circuit elements 818 effectively form two-input, one-output, voltage based soft XOR circuits using the circuit elements 812, 814, and 816 introduced with reference to FIG. 15A. These groups of circuit elements 818 are then arranged in a tree structure, preferably a binary tree structure that is as balanced as possible to form the circuit arrangement 820 shown in the figure. In some implementations, the branching structure shown in FIG. 15B may have preferable characteristics, for instance, providing a better approximation of the ideal soft XOR function with LLR representations. Furthermore, when multiple modules 820 are implemented for a set of unidirectional XOR circuits, certain computations can be shared, for example, by passing a signal 825 from one module to another where a portion of the tree in that other module can be eliminated.

Figure 16:
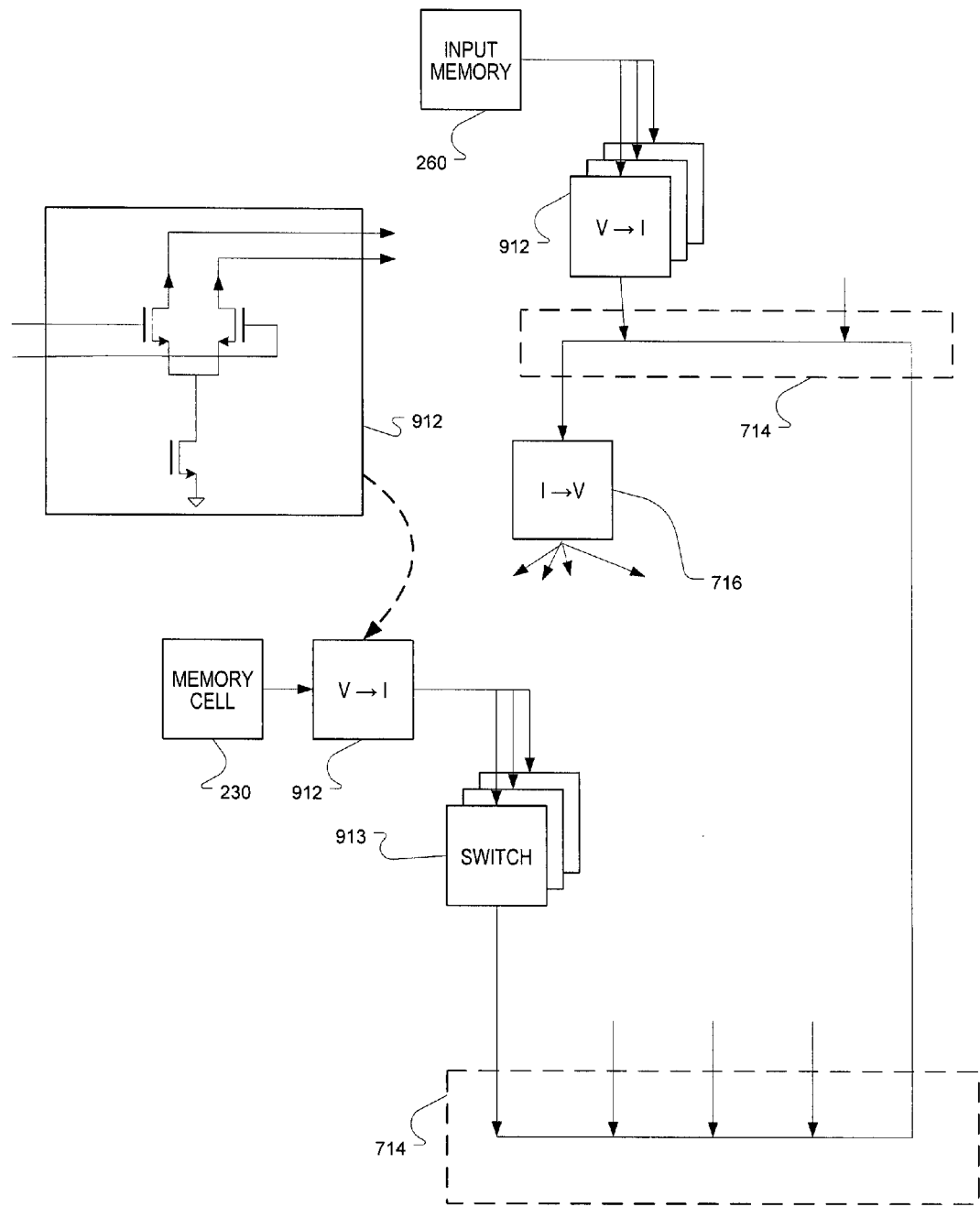
FIG. 16 is a diagram that illustrates a distributed bus implementation of a variable node.

Referring to FIG. 16, in some implementations, the bus 714 associated with each equal gate is distributed. Each memory cell 230, which stores its value as a differential voltage, has at its output a corresponding voltage to current converter 912. These voltage to current converters are similar to the converters 712 shown in FIG. 14. The current output is passed to a set of switches 913, at most one of which is enabled if the corresponding cell's value is to be injected as a current on a current bus 714 corresponding to that switch 913. Each bus 714 similarly includes a portion onto which current associated with an appropriate input bit is injected at each cycle to account for the input to the equal gate corresponding to the bit input. Note that the bus 714 for each equal node may have a complex structure, for example, having numerous branches. Nevertheless, all the current injected onto the bus passes to the current to voltage converter 716 for the equal node, from where it branches to the unidirectional XOR circuits that require that output.

Figure 17:
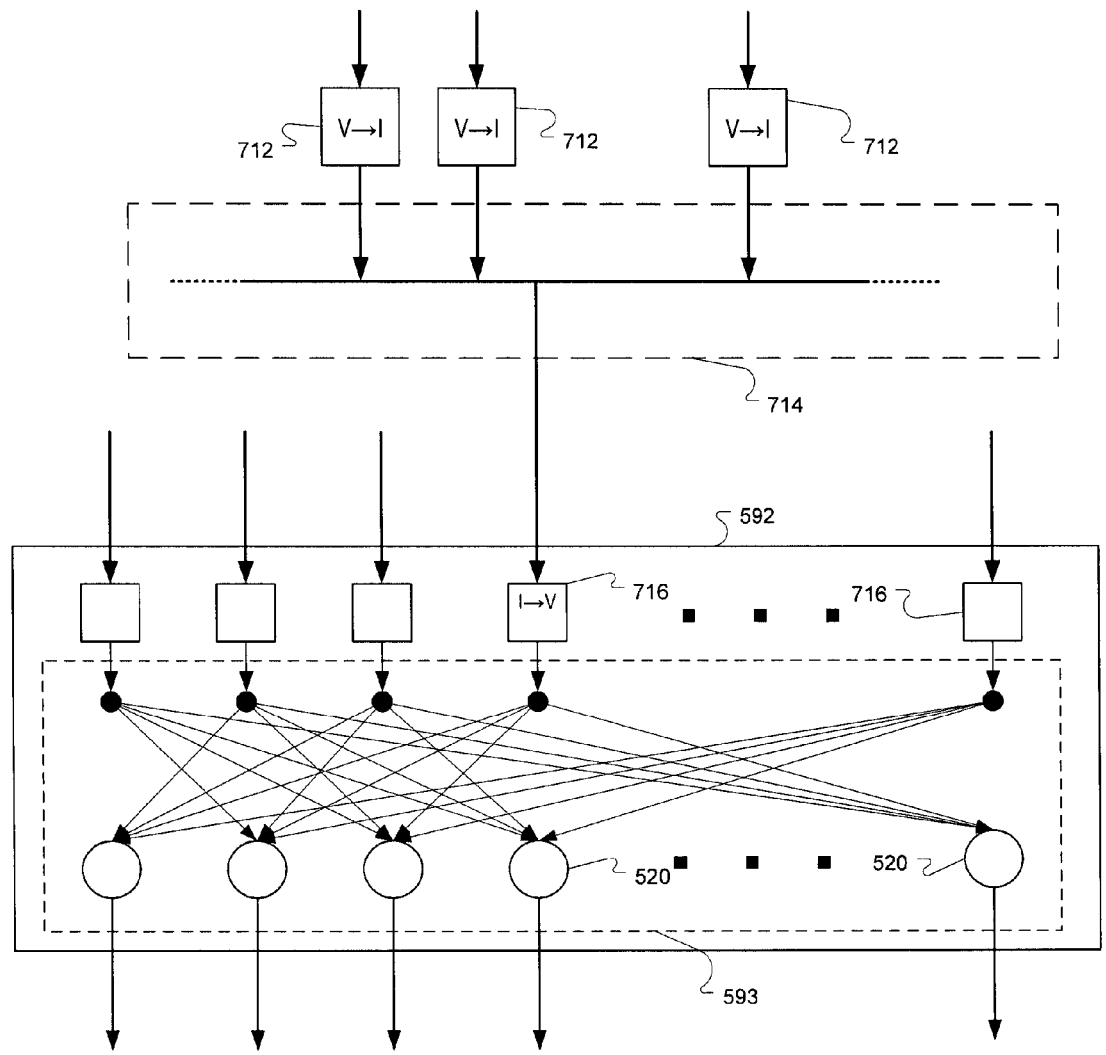
FIG. 17 is a diagram of an alternative shared module.

Referring to FIG. 17, in some implementations that make use of a distributed bus 714 to perform a current summation function, the module 590 illustrated in FIG. 12 is replaced by a module 592 in conjunction with distributed busses 714 and voltage-to-current converters 712. In module 592, each variable node corresponds to a current-to-voltage converter 716, which outputs a voltage proportional to the total injected current on the corresponding bus 714, and then that voltage branches to the appropriate check node circuits 520. Note that in yet other implementations, the current-to-voltage converters 716 are themselves distributed, and a module 593 (i.e., a portion of module 592) receives voltage inputs, which are internally distributed to the appropriate check node circuits.

Figure 18:
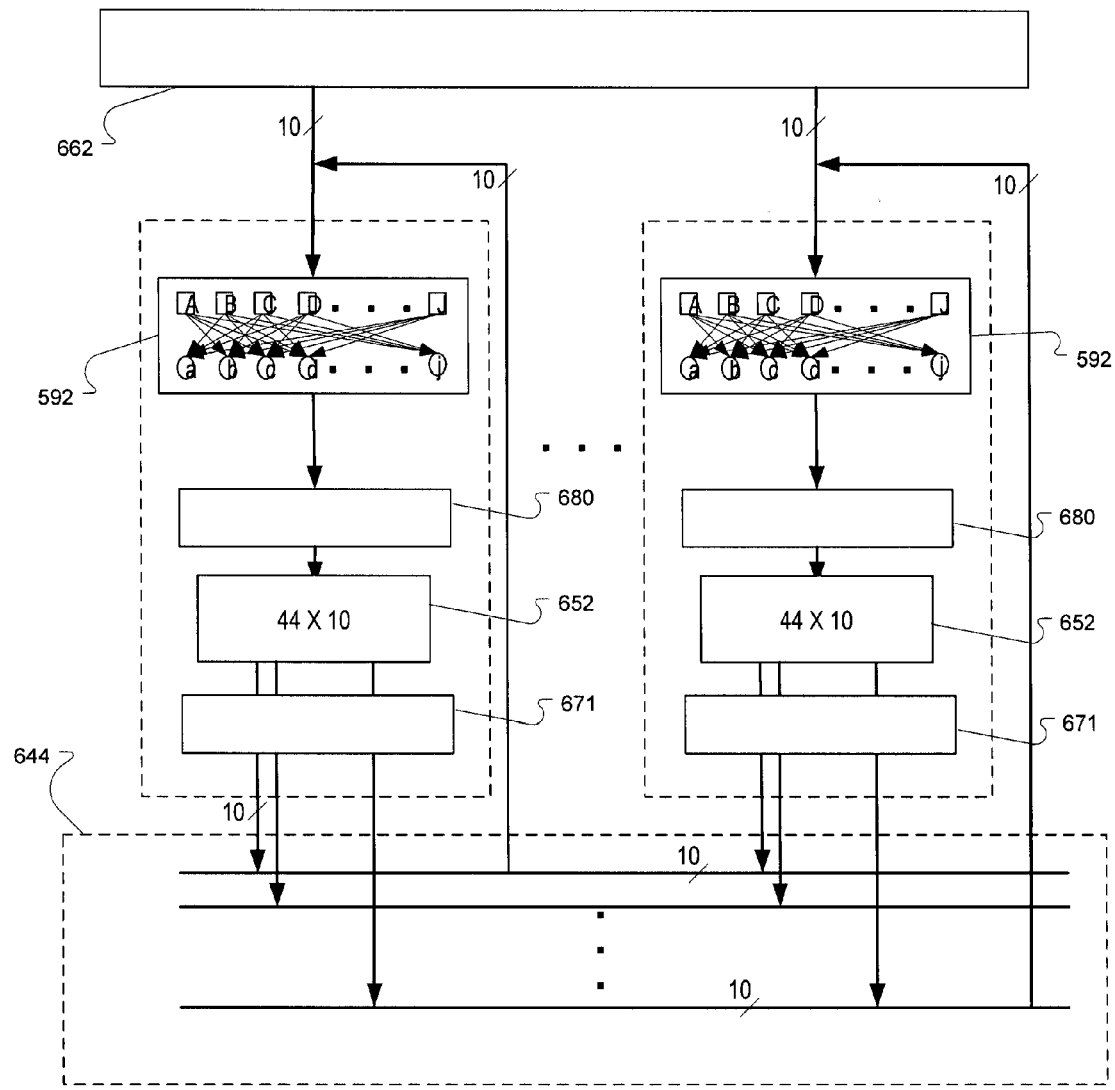
FIG. 18 is a block diagram of a decoder that uses distributed bus implementations of variable nodes.

Referring to FIG. 18, a second example of an implementation of a decoder operable to perform the iterative stage of decoding operation for use with the (1056, 352) LDPC code shown in FIG. 11 provides the same or similar functionality to the implementation shown in FIG. 13. In this example, modules 592 are used, as illustrated in FIG. 17. The circuitry that implements each soft Equals circuit associated with a variable node includes a current-to-voltage converter in the module 592, with the distributed busses corresponding to the 10 unidirectional variable nodes of the module 592 being distributed. Each memory 652 includes circuitry to inject current to the appropriate busses corresponding to the soft Equal circuits for different variable nodes via read switching circuits 671. The bus section 644 effectively includes 81 busses, each associated with a different current-to-voltage converter 716 at the input of a module 592. Therefore, the soft Equal circuit is distributed in a manner effectively forms interconnection paths between the memories 652 and the analog computation modules 592.

It should be understood that the decoder applications described above are only one example of an application of an analog belief propagation processor. The techniques employed in these examples are applicable to other uses of belief propagation.

It is to be understood that the foregoing description is intended to illustrate and not to limit the scope of the invention, which is defined by the scope of the appended claims. Other embodiments are within the scope of the following claims.

What is claimed is:

1. An analog processor comprising:
   a first memory module for storing a first set of storage values in respective storage elements each representing a respective input to the processor;
   a second memory module for storing a second set of storage values in analog form in respective storage, the second set of storage values including intermediate values determined during operation of the processor;
   an analog computation module coupled to the first and the second memory modules, the analog processor being configurable such that in each of a plurality of operation cycles the analog computational module determines values for at least some of the second set of storage values based on at least some of the first and the second sets of storage values; and
   an output module for generating a set of outputs at least in part from the at least some of the second set of storage values.

2. The analog processor of claim 1 wherein the first storage module is configured to store the first set of storage values in analog form.

3. The analog processor of claim 1 wherein the analog computation module is linked to the first and the second memory modules via analog signal paths.

4. The analog processor of claim 3 in which the analog signal paths are each configured to carry a value on a conductor represented as at least one of a voltage and a current proportional to the value.

5. The analog processor of claim 1, wherein the analog computational module is configurable to determine values for a different subset of the second set of storage values in corresponding cycles of the plurality of operation cycles.

6. The analog processor of claim 1 further comprising input selection circuitry configurable to couple the analog computation module to outputs of selected memory elements of the first and the second memory modules.

7. The analog processor of claim 1 further comprising, for each analog computation module, a plurality of signal busses, each bus providing an input value to the analog computation module and being switchably coupled to a plurality of the storage elements of the second memory module.

8. The analog processor of claim 7 wherein the storage elements are coupled to switchably provide a current representation of a storage value stored in the storage element such that the input value provided to the analog computation module is represented as a current that is substantially proportional to a sum of the currents representations provided by the storage elements.

9. The analog processor of claim 1 further comprising output section circuitry configurable to accept outputs of selected memory elements of the first and the second memory modules, and to determine outputs of the analog processor.

10. The analog processor of claim 1 comprising a plurality of analog computation modules, said modules being concurrently operable to determines values for different subsets of the second set of storage values in each operation cycle.

11. The analog processor of claim 10 wherein the second memory module includes a plurality of sections, each associated with a corresponding different one of the analog computation modules for storing values determined by the analog computation module.

12. The analog processor of claim 10 wherein the second memory module is configured such that in a single operation cycle, each storage element can provide a storage value to one or more of the analog computation modules and can accept a determined value to store in the storage element for providing in a subsequent operation cycle.

13. The analog processor of claim 12 wherein each storage element is associated with two storage locations such that in any one cycle, one storage location being used for accepting a determined value and another storage location being used for providing a value.

14. The analog processor of claim 10 wherein the second memory module includes a plurality of memory sections, groups of the sections forming banks, wherein for each of the analog computation modules each of a plurality of inputs to the module is associated with a different bank of the memory sections.

15. The analog processor of claim 1 configured to implement a belief propagation computation.

16. The analog processor of claim 1 configured to implement a factor graph computation.

17. The analog processor of claim 16 wherein the a analog processor is configured to implement a decoder for a low density parity check (LDPC) code.

18. The analog processor of claim 1 further comprising:
   a controller configured to control operation of the analog processor to perform a plurality of iterations of computation, each iteration comprising the plurality of computation cycles.

19. The analog processor of claim 18 wherein the plurality of computation cycles is substantially the same in each iteration, each cycle being associated with a configuration of the first and the second storage modules to provide inputs and output to one or more analog computation modules.

20. The analog processor of claim 18 wherein the analog processor is at least one of configured and configurable to implement a decoder parity check code, and each cycle is associated with one or more parity check constraints, and wherein the cycles of each iteration are together associated with all the parity check constraints of the code.

21. The analog processor of claim 1 wherein the analog computation module implements a network of analog processing elements.

22. The analog processor of claim 21 wherein the analog processing elements include elements that represent soft logical operations.

23. The analog processor of claim 22 wherein the soft logical operations include soft XOR operations.

24. The analog processor of claim 21 wherein the network of elements is acyclic.

25. The analog processor of claim 21 wherein the network of elements includes at least one cycle of elements, the analog computation module being configured to implement a relaxation computation.

* * * * *